(12) United States Patent
Iwai

(10) Patent No.: US 12,249,388 B2
(45) Date of Patent: Mar. 11, 2025

(54) MEMORY SYSTEM AND NONVOLATILE MEMORY FOR IMPROVING RELIABILITY OF STORED DATA AND SHORTENING OPERATION TIME

(71) Applicant: Kioxia Corporation, Tokyo (JP)

(72) Inventor: Katsuhiko Iwai, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 284 days.

(21) Appl. No.: 17/887,985

(22) Filed: Aug. 15, 2022

(65) Prior Publication Data

US 2023/0307084 A1 Sep. 28, 2023

(30) Foreign Application Priority Data

Mar. 24, 2022 (JP) ................. 2022-047668

(51) Int. Cl.
| | | |
|---|---|---|
| *G11C 16/10* | (2006.01) | |
| *G11C 11/408* | (2006.01) | |
| *G11C 11/4094* | (2006.01) | |
| *G11C 11/4096* | (2006.01) | |
| *G11C 29/52* | (2006.01) | |

(52) U.S. Cl.
CPC .......... *G11C 29/52* (2013.01); *G11C 11/4085* (2013.01); *G11C 11/4094* (2013.01); *G11C 11/4096* (2013.01)

(58) Field of Classification Search
CPC ............ G11C 11/5628; G11C 16/0483; G11C 11/5642; G11C 16/3431; G11C 16/3495; G11C 2029/0411; G06F 11/10
See application file for complete search history.

(56) References Cited

U.S. PATENT DOCUMENTS

| | | | |
|---|---|---|---|
| 8,953,379 B2 | 2/2015 | Cerafogli et al. | |
| 9,627,388 B2 | 4/2017 | Kang et al. | |
| 10,650,885 B2 | 5/2020 | Li | |
| 2012/0144267 A1* | 6/2012 | Yeh ...................... | G11C 11/5642 714/763 |
| 2013/0185609 A1* | 7/2013 | Park ..................... | G06F 11/0751 714/E11.023 |
| 2016/0098216 A1* | 4/2016 | Huang ................... | G06F 11/073 714/37 |
| 2019/0026181 A1* | 1/2019 | Kim ........................ | G11C 29/52 |
| 2020/0090763 A1* | 3/2020 | Tokutomi ............ | G11C 11/5642 |
| 2021/0295941 A1* | 9/2021 | Asami ..................... | G11C 29/42 |

* cited by examiner

*Primary Examiner* — Mushfique Siddique
(74) *Attorney, Agent, or Firm* — Foley & Lardner LLP

(57) ABSTRACT

A memory system includes a nonvolatile memory and a control circuit. The nonvolatile memory includes a plurality of word lines, a plurality of bit lines, and a plurality of storage elements. The control circuit includes an ECC circuit that detects and corrects a data error stored in the plurality of storage elements, acquires first data by reading data stored in the plurality of storage elements of a page connected to the same word line with a first read voltage, acquires second data obtained by correcting the first data when the first data can be corrected by the ECC circuit, and writes data based on the second data to the plurality of storage elements of the page.

18 Claims, 11 Drawing Sheets

MEMORY SYSTEM AND NONVOLATILE MEMORY FOR IMPROVING RELIABILITY OF STORED DATA AND SHORTENING OPERATION TIME

CROSS-REFERENCE TO RELATED APPLICATION

This application is based upon and claims the benefit of priority from Japanese Patent Application No. 2022-047668, filed Mar. 24, 2022, the entire contents of which are incorporated herein by reference.

FIELD

Embodiments described herein relate generally to a memory system and a nonvolatile memory.

BACKGROUND

A memory system including a nonvolatile memory and a memory controller that controls an operation of the nonvolatile memory based on a control signal from an external host is known. In addition, a nonvolatile memory including a memory cell array and a sequencer that controls an operation of the memory cell array is known.

DETAILED DESCRIPTION

Figure 1:
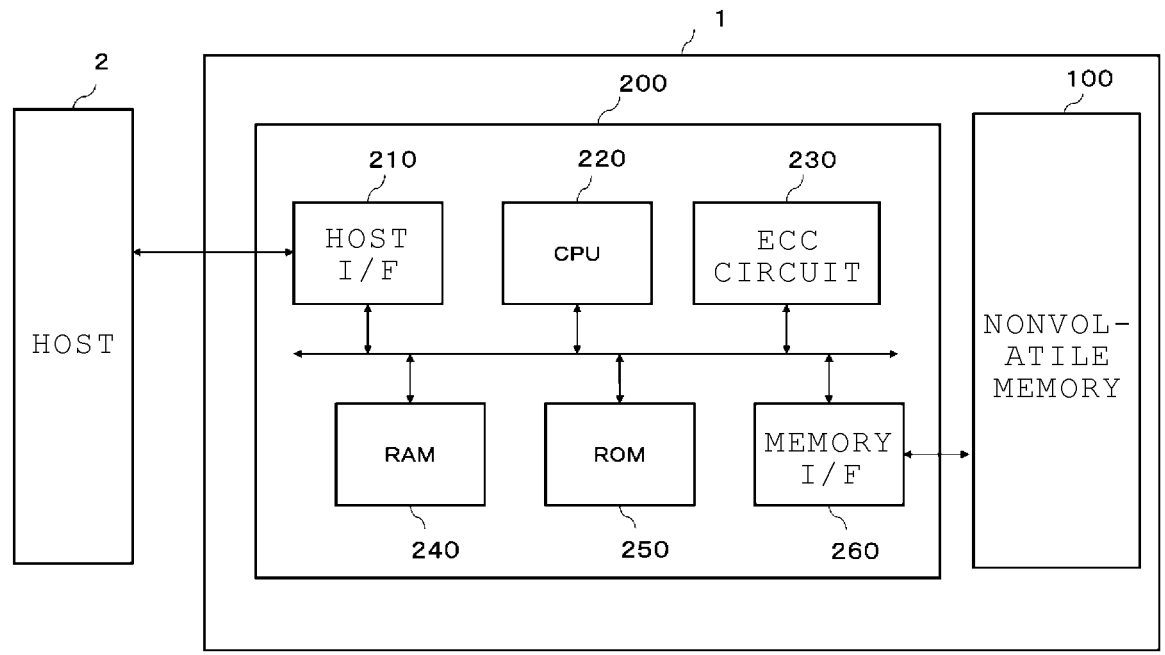
FIG. 1 is a block diagram illustrating an example of a configuration of a memory system according to a first embodiment.

Embodiments provide a memory system and a nonvolatile memory that can improve reliability of stored data and shorten operation time.

In general, according to at least one embodiment, a memory system includes a nonvolatile memory and a control circuit. The nonvolatile memory includes a plurality of word lines, a plurality of bit lines, and a plurality of storage elements. The control circuit includes an ECC circuit that detects and corrects a data error stored in the plurality of storage elements, acquires first data by reading data stored in the plurality of storage elements of a page unit connected to the same word line with a first read voltage, acquires second data obtained by correcting the first data when the first data can be corrected by the ECC circuit, and writes data based on the second data to the plurality of storage elements of the page unit.

Hereinafter, embodiments for carrying out the disclosure are described with reference to the drawings. The drawings are schematic, and for example, a relationship between a thickness and a plane dimension, a ratio of a thickness of each layer, and the like may differ from the actual ones. Further, in the embodiment, substantially the same components are designated by the same reference numerals, and the description thereof is omitted.

First Embodiment

FIG. 1 is a block diagram illustrating an example of a configuration of a memory system according to a first embodiment. As illustrated in FIG. 1, a memory system 1 includes a nonvolatile memory 100 and a memory controller 200. The memory system 1 is controlled by a host 2. The memory controller 200 is an example of a control circuit.

The nonvolatile memory 100 is, for example, a NAND-type flash memory. The configuration of the nonvolatile memory 100 is described with reference to FIGS. 2 to 4 below.

Further, the nonvolatile memory 100 is not limited to a NAND-type flash memory, and may be a NOR-type flash memory, a magneto-resistive random access memory (MRAM), a phase change random access memory (PRAM), a resistive random access memory (ReRAM), and a ferroelectric random access memory (FeRAM).

The memory controller 200 receives an instruction from the host 2 and controls an operation of the nonvolatile memory 100 based on the received instruction. The memory controller 200 includes, for example, a host interface circuit (host I/F) 210, a central processing unit (CPU) 220, an error checking and correcting (ECC) circuit 230, a random access memory (RAM) 240, a read only memory (ROM) 250, and a memory interface circuit (memory I/F) 260. The memory controller 200 may be configured, for example, as a System on a Chip (SoC).

The host I/F 210 is connected to the host 2 via a host bus. The host I/F 210 controls communication between the memory controller 200 and the host 2. The memory I/F 260 transmits and receives a control signal between the memory controller 200 and the nonvolatile memory 100. The memory I/F 260 is connected to the nonvolatile memory 100 via a memory bus. The memory bus is a bus that transmits and receives a signal, for example, based on a NAND interface.

The ROM 250 stores, for example, firmware. The RAM 240 can store firmware read, for example, from the RAM 240. The RAM 240 is used as a work area of the CPU 220. The RAM 240 temporarily stores data receives from the host 2 or data read from the nonvolatile memory 100 and functions as a buffer and a cache.

The CPU 220 controls the entire operations of the memory system 1. The CPU 220 executes firmware read, for example, from the ROM 250 to the RAM 240.

The ECC circuit 230 detects and corrects a data error. For example, when data is written, the ECC circuit 230 generates an error correction code for the write data. Also, the generated error correction code is added to the write data and is sent to the memory I/F 260. In addition, for example, when the data is read, the ECC circuit 230 detects and corrects a data error with respect to the read data by using the error correction code provided in the read data. The ECC circuit 230 may be provided in the memory I/F 260.

Figure 2:
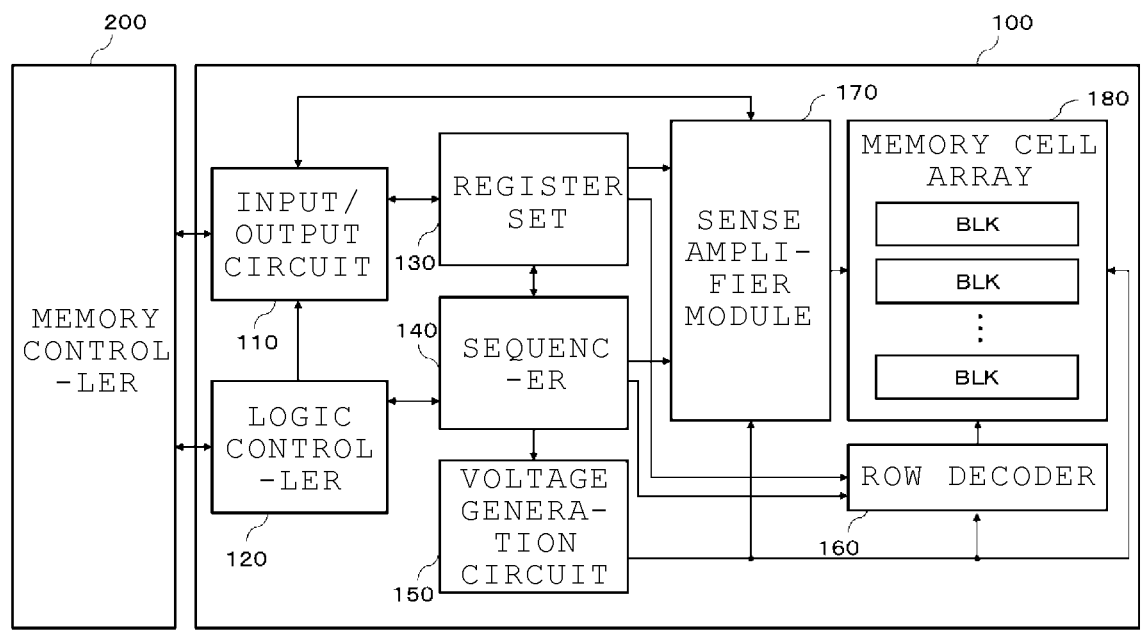
FIG. 2 is a block diagram illustrating an example of a configuration of the nonvolatile memory according to the first embodiment.
Figure 3:
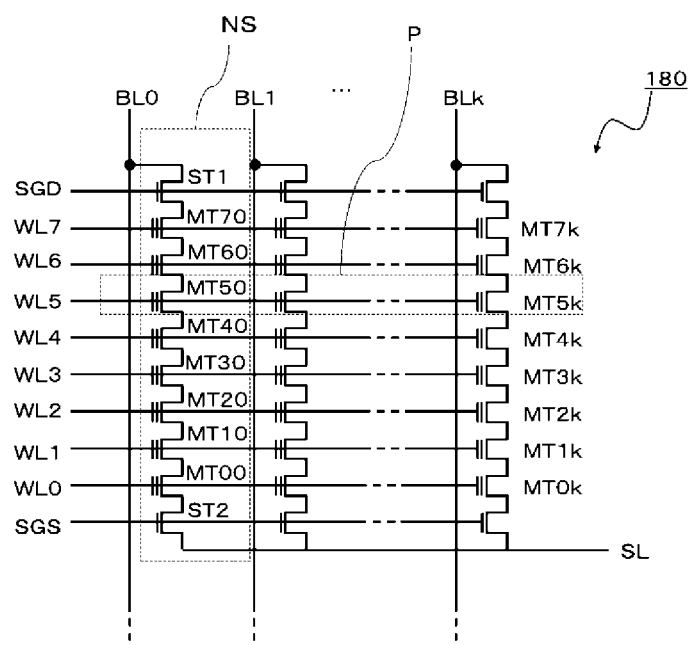
FIG. 3 is a circuit diagram illustrating an example of a configuration of the memory cell array according to the first embodiment.
Figure 4:
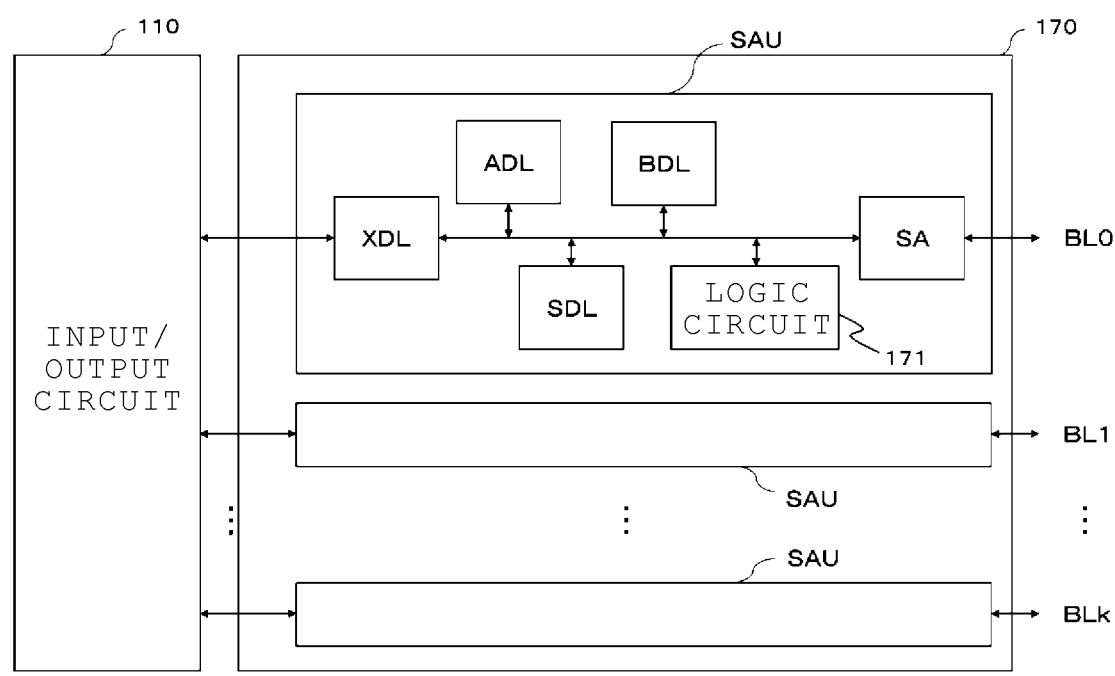
FIG. 4 is a block diagram illustrating an example of a configuration of a sense amplifier module according to the first embodiment.

The configuration of the nonvolatile memory 100 is described with reference to FIGS. 2 to 4. FIG. 2 is a block diagram illustrating an example of the configuration of the nonvolatile memory according to the first embodiment. FIG. 3 is a circuit diagram illustrating an example of the configuration of the memory cell array according to the first embodiment. FIG. 4 is a block diagram illustrating an example of the configuration of the sense amplifier module according to the first embodiment.

As illustrated in FIG. 2, the nonvolatile memory 100 includes an input/output circuit 110, a logic controller 120, a register set 130, a sequencer 140, a voltage generation circuit 150, a row decoder 160, a sense amplifier module 170, and a memory cell array 180.

The input/output circuit 110 transmits and receives a signal to and from the memory controller 200. The signal includes, for example, data, a status, an address, or a command. In addition, the input/output circuit 110 transmits and receives data to and from the sense amplifier module 170.

The logic controller 120 controls the input/output circuit 110 and the sequencer 140 based on the control signal received from the memory controller 200.

The register set 130 includes, for example, a status register, an address register, and a command register. The status register stores the status. The address register stores the address. The command register stores the command.

The sequencer 140 controls the entire operations of the nonvolatile memory 100 based on the command stored in the command register. The sequencer 140 is an example of a control circuit. In addition, a configuration of memory system 1 other than the memory cell array 180 may be an example of a control circuit. The sequencer 140 controls the row decoder 160, the sense amplifier module 170, and the voltage generation circuit 150 and executes, for example, a write operation and a read operation.

The voltage generation circuit 150 generates the voltage based on the control by the sequencer 140. The generated voltage is supplied to the row decoder 160, the sense amplifier module 170, and the memory cell array 180. As illustrated in FIG. 3, the voltage generation circuit 150 generates voltages to be supplied to an operation target among word lines WL0 to WL7, an operation target among bit lines BL0 to BLk, and a source line SL, for example, during the write operation, the read operation, and the erasing operation. The voltage generation circuit 150 supplies the generated voltage to be applied the word line to the row decoder 160. The voltage generation circuit 150 supplies the generated voltage to be applied to the bit line to the sense amplifier module 170. The voltage generation circuit 150 supplies the generated voltage to be applied to the source line SL to the source line SL.

The memory cell array 180 includes a plurality of blocks BLK. The block BLK is, for example, a data erasing unit. As illustrated in FIG. 3, the block BLK includes a plurality of storage elements associated with the bit lines BL0 to BLk and the word lines WL0 to WL7. The storage elements according to the present embodiment are memory cell transistors MT00 to MT70.

The block BLK includes a plurality of NAND strings NS. The NAND string NS is associated with corresponding bit lines among the bit lines BL0 to BLk (k is a natural number). The NAND string NS includes, for example, the memory cell transistors MT00 to MT70 and select transistors ST1 and ST2. The memory cell transistors MT00 to MT70, and MT0$k$ to MT7$k$ include control gates and charge storage layers, and store data in a nonvolatile manner. The select transistors ST1 and ST2 each are used for selection of the NAND string NS including the select transistors ST1 and ST2 during an operation.

In addition, the block BLK includes a plurality of pages P. The page P includes a plurality of memory cell transistor commonly connected to the same word line, and used as a data writing unit and a data read unit. That is, data is written and read in page units, by using the plurality of memory cell transistors commonly connected to the same word line as a data writing unit and a data read unit. For example, the data stored in the plurality of memory cell transistors MT50 to MT5$k$ are read by using the plurality of memory cell transistors MT50 to MT5$k$ connected to the word line WL5 as page units.

The row decoder 160 receives a row address from the address register, and decodes the received row address. The row decoder 160 selects the block BLK to be subjected to the operation based on the decoded result. The row decoder 160 can transmit a voltage supplied from the voltage generation circuit 150 to the selected block BLK.

The sense amplifier module 170 receives a column address from an address register and decodes the received column address. The sense amplifier module 170 performs a data transmission operation between the input/output circuit 110 and the memory cell array 180 based on the decoding result.

As illustrated in FIG. 4, the sense amplifier module 170 includes a plurality of sense amplifier units SAU corresponding to a plurality of bit lines. The sense amplifier unit SAU includes a sense amplifier SA connected to a bit line, data latches ADL, BDL, SDL, and XDL, and a logic circuit 171. The sense amplifier SA, the data latches ADL, BDL, SDL, and XDL, and the logic circuit 171 are connected by a bus.

Data provided in a data latch in the sense amplifier SA is appropriately transmitted to the data latches ADL, BDL, SDL, and XDL. The logic circuit 171 performs a logical operation on the data, for example, among the data latches ADL, BDL, SDL, and XDL and calculates data stored in the memory cell transistor. In addition, the data latch XDL is connected to the input/output circuit 110. In addition, the data latches ADL, BDL, SDL, and XDL store data written to the memory cell transistor and data read from the memory cell transistor.

Figure 5:
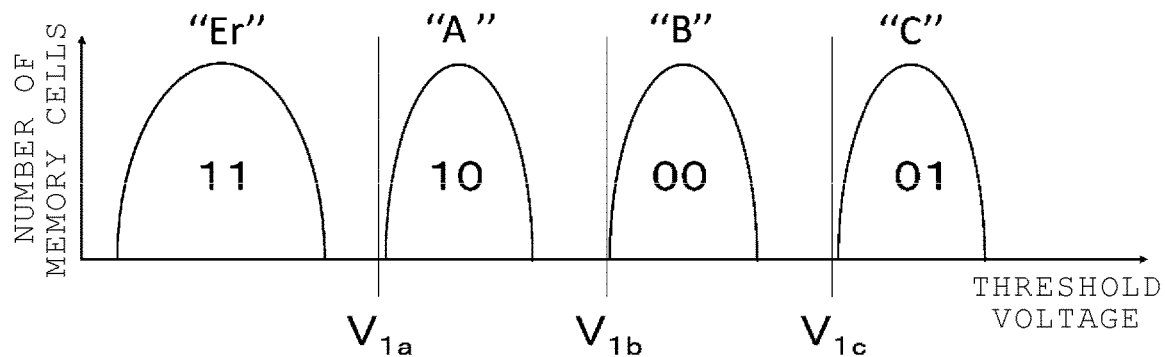
FIG. 5 is a schematic diagram illustrating a threshold voltage distribution of the nonvolatile memory according to the first embodiment.
Figure 6:
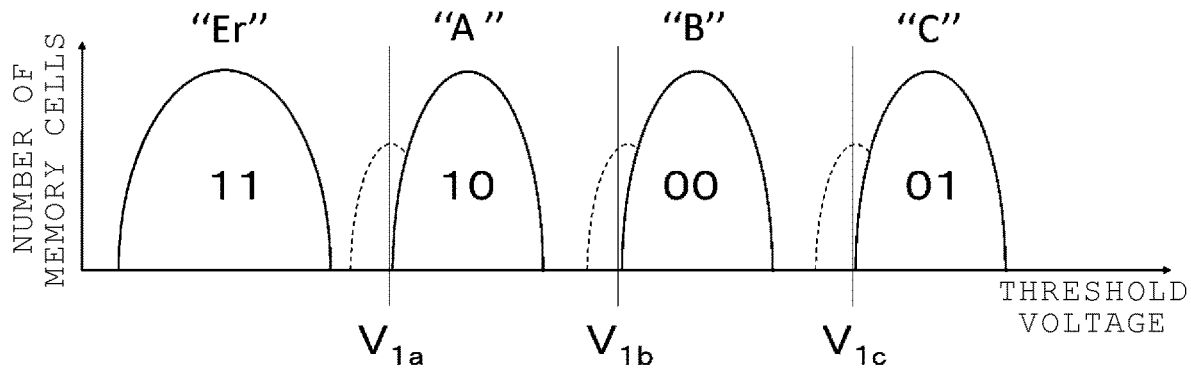
FIG. 6 is a schematic diagram illustrating the threshold voltage distribution of the nonvolatile memory for explaining data retention according to the first embodiment.

In the nonvolatile memory 100 according to the present embodiment, data retention generated before executing a refresh program (described with reference to FIGS. 7 and 8 described below) is described with reference to FIGS. 5 and 6. FIG. 5 is a schematic diagram illustrating the threshold voltage distribution of the nonvolatile memory according to the first embodiment. FIG. 6 is a schematic diagram illustrating the threshold voltage distribution of the nonvolatile memory for explaining data retention according to the first embodiment.

The memory system 1 can use, for example, some operation methods. According to the present embodiment, threshold voltage distribution in a case of using a multi-level cell (MLC) method is described as an operation method.

As illustrated in FIG. 5, if the MLC method is used, the threshold voltages of the plurality of memory cell transistors form four threshold voltage distributions. This four threshold voltage distributions are respectively referred to as an "Er" state, an "A" state, a "B" state, a "C" state, in an ascending order of the threshold voltages. In the MLC method, different 2-bit data is assigned to the threshold voltage distributions including the "Er" state to the "C" state, respectively. For example, 11 is assigned to the "Er" state, 10 is assigned to the "A" state, 00 is assigned to the "B" state, and 01 is assigned to the "C" state.

In addition, read voltage can be set between adjacent threshold voltage distributions, respectively. Specifically, a first read voltage V1a can be set between the maximum threshold voltage in the "Er" state and the minimum threshold voltage in the "A" state. In the same manner, a first read voltage V1b can be set between the "A" state and the "B" state. A first read voltage V1c can be set between the "B" state and the "C" state. If the first read voltages V1a, V1b, and V1c are not distinguished from each other, the first read voltages V1a, V1b, and V1c are simply referred to as the first read voltages V1. For example, the first read voltage V1 is a threshold voltage set in advance, for example, at the time of shipping the nonvolatile memory 100. In addition, by using the first read voltage V1, data immediately after the writing can be correctly read.

According to the present embodiment, the data retention means that the charge stored by the charge storage layer provided in the memory cell transistor disappears, for example, due to the passage of time, temperature change, and impact. As illustrated with a dotted line in FIG. 6, if the data retention occurs, it is likely that the threshold voltage of the memory cell transistor changes. If the threshold voltage is changed, when data is read, the data that is not written data is shown. According to the present embodiment, the written data is referred to as second data. In addition, if data retention is affected, the threshold voltage of the memory cell transistor is reduced.

A memory cell transistor showing data different from second data is detected as an error by the ECC circuit 230. For example, if the affection of the data retention is small, when data is read with the first read voltage V1, there are less memory cell transistors indicating data that is not the second data. Therefore, the second data can be obtained by correcting the data error with the ECC circuit 230. Meanwhile, if the affection of the data retention is large, when data is read with the first read voltage V1, there are many memory cell transistors showing data that is not the second data. Therefore, it is likely that data cannot be corrected by the ECC circuit 230, and the second data cannot be obtained. The nonvolatile memory 100 according to the present embodiment executes a refresh program for rewriting the data in order to store the second data.

In addition, whether the threshold voltage of the memory cell transistor is changed cannot be found without reading data. The nonvolatile memory 100 according to the present embodiment verifies, for example, each block BLK whether the data retention is affected.

Figure 7:
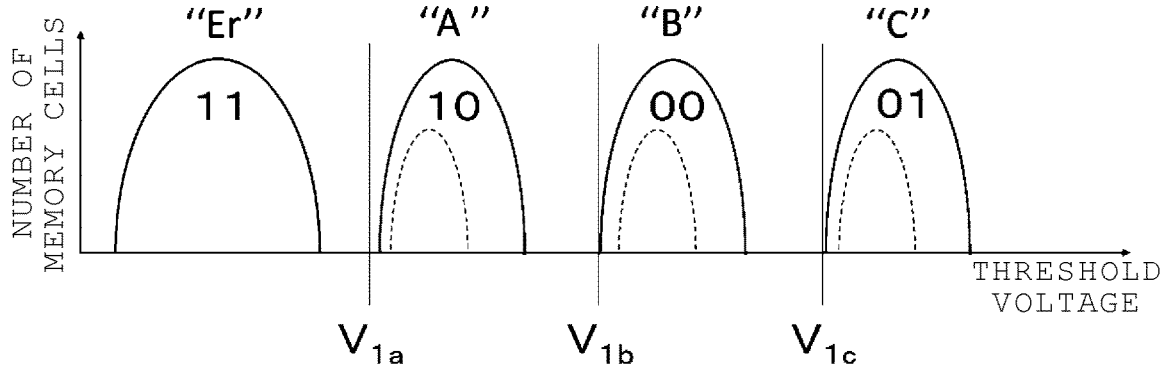
FIG. 7 is a schematic diagram illustrating the threshold voltage distribution after a refresh program of the nonvolatile memory according to the first embodiment.
Figure 8:
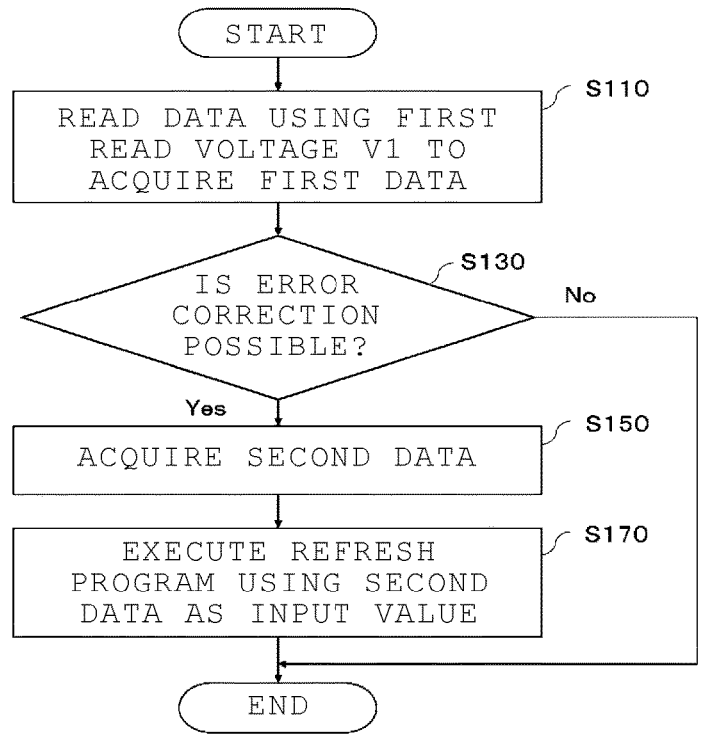
FIG. 8 is a flowchart showing a refresh program of the nonvolatile memory according to the first embodiment.

The refresh program in the nonvolatile memory 100 according to the present embodiment is described with reference to FIGS. 7 and 8. FIG. 7 is a schematic diagram illustrating the threshold voltage distribution after a refresh program of the nonvolatile memory according to the first embodiment. FIG. 8 is a flowchart showing the refresh program of the nonvolatile memory according to the first embodiment. According to the present embodiment, the refresh program means a write operation for returning the memory cell transistor of which the threshold voltage is changed to the threshold voltage immediately after the write operation.

FIG. 7 shows the threshold voltage distribution after the refresh program is executed, according to the present embodiment. The dotted line of FIG. 7 shows charges affected by the data retention shown by the dotted line of FIG. 6. According to the present embodiment, a refresh program is executed on all of the memory cell transistors in any of the pages P. That is, a refresh program is executed on both of the memory cell transistor of which the threshold voltage is changed and the memory cell transistor of which the threshold voltage is not changed.

As illustrated in FIG. 8, first, the CPU 220 reads data by using the first read voltage V1 from any of the pages P (S110). The data read with the first read voltage V1 is referred to as the first data.

The CPU 220 verifies whether first data error can be corrected by the ECC circuit 230 (S130). If the error correction is not possible (S130; NO), the operation is completed without executing the refresh program. If the error correction is possible (S130; YES), the CPU 220 can acquire second data based on the first data (S150). That is, the second data is data obtained by correcting the first data with the ECC circuit 230.

The CPU 220 writes the second data on any of the pages P that is read in S110. That is, the refresh program that uses the second data as the input value is executed (S170). To use the second data as the input value is to execute the refresh program on all of the memory cell transistors in any of the pages P. For example, in the refresh program according to the present embodiment, writing is performed by applying first write voltages to all of the memory cell transistors in any of the pages P. The first write voltage is applied once. In addition, after applying the first write voltage, the verification operation is not performed.

In addition, in S170, when the second data is written, the first write voltage is applied once. However, the second data may be written by applying different write voltages a plurality of times in a divided manner. In addition, it is described that the verification operation is not performed, but the verification operation may be performed. If different write voltages are applied a plurality of times in a divided manner, the verification operation may be performed when applying the write voltage.

In the above, the refresh program is completed. The same is performed on the other pages P provided in the same block BLK.

Effect

Figure 9:
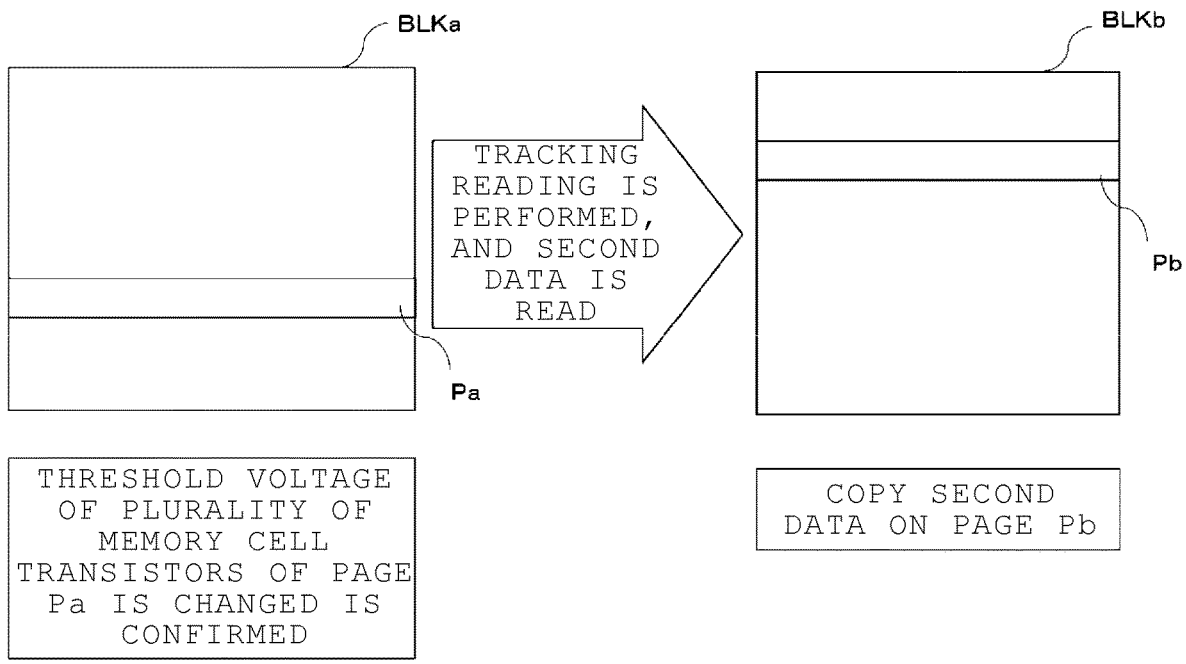
FIG. 9 is a diagram schematically illustrating a memory cell array according to a comparative example.

As a comparative example, a method of performing a tracking read operation if the change of the threshold voltages of a plurality of memory cell transistors in a page Pa is verified is applied, and is described with reference to FIG. 9. FIG. 9 is a diagram schematically illustrating the memory cell array according to the comparative example. In the comparative example, whether the data retention is affected on a block BLKa is verified.

If it is verified that the threshold voltage is changed in the plurality of memory cell transistors in the page Pa of the block BLKa, the tracking read operation is performed as the read retry operation. The tracking read operation is a method of reading data with a plurality of read voltages, searching an optimum read voltage, and reading data with the optimum read voltage. By the tracking read operation, the second data can be read. In the tracking read operation, the read operation is performed a plurality of times, and thus the operation processing time becomes long.

In addition, after the tracking read operation is performed, the second data is copied to a page Pb of a block BLKb. Accordingly, the affection of the data retention can be eliminated. Meanwhile, since the operation is performed on all pages of the block BLKa, the processing time of the read operation and the write operation becomes long.

According to the present embodiment, if it is verified that the threshold voltage is changed, the second data can be stored without performing the read retry operation. Therefore, according to the present embodiment, the tracking read operation is not performed, and thus the operation processing time is short. That is, while the operation processing time of the memory system 1 is shortened, the reliability of the nonvolatile memory 100 can be improved.

In addition, the first write voltage is applied once. Further, after the first write voltage is applied, the verification operation is not performed. Therefore, the operation processing time of the memory system 1 can be shortened.

Further, in S170, if the error correction is not possible (S130; NO), the read retry operation may be performed. The refresh program may be executed based on the second data obtained by performing the read retry operation.

Second Embodiment

An execution target of the refresh program of the second embodiment is different from that of the first embodiment.

Figure 10:
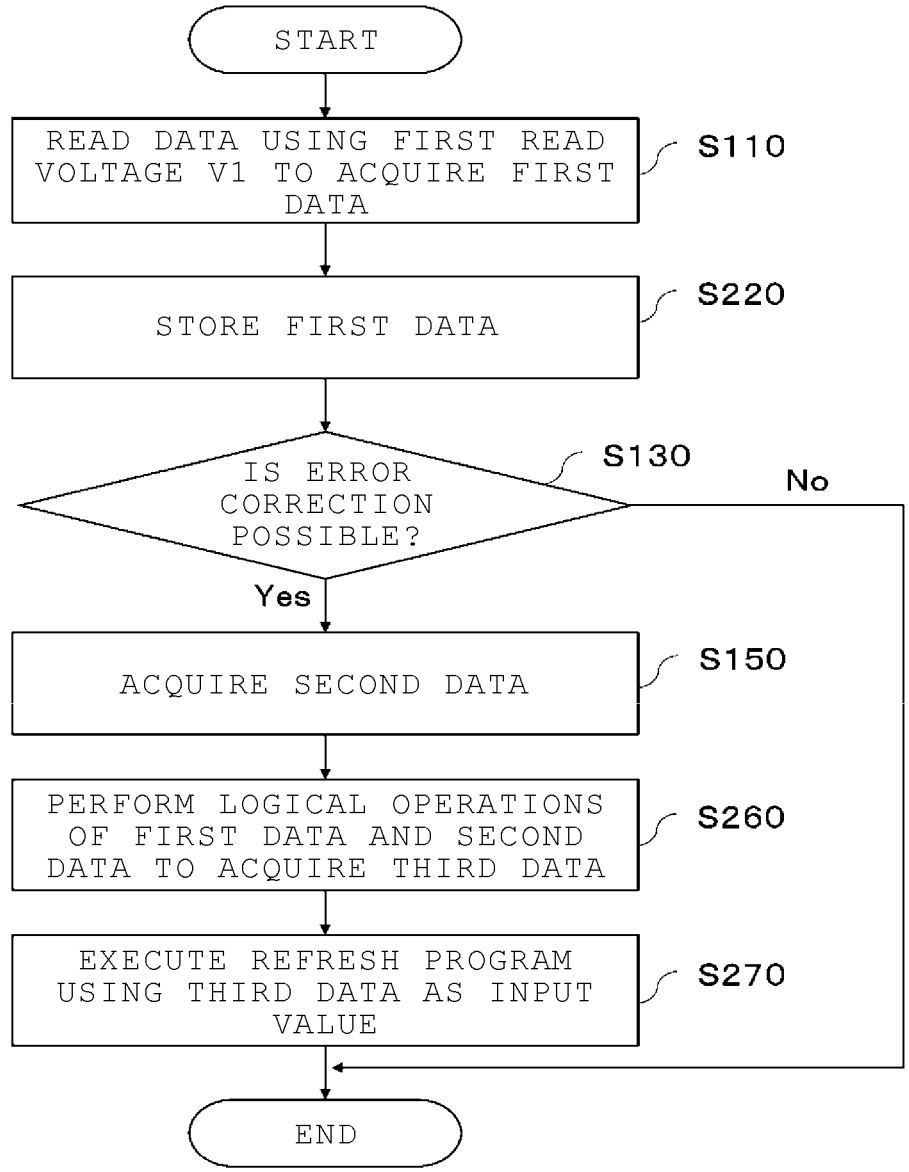
FIG. 10 is a flowchart showing a refresh program of a nonvolatile memory according to a second embodiment.

FIG. 10 is a flowchart showing the refresh program of the nonvolatile memory according to the second embodiment. According to the present embodiment, the refresh program is executed on a memory cell transistor of which the threshold voltage is changed. That is, the memory cell transistors shown with the dotted line of FIG. 6 become targets of the refresh program.

If data is read from any of the pages P with the first read voltage V1 (S110), the CPU 220 stores the read first data, for example, in the RAM 240 (S220).

The CPU 220 verifies whether the error correction of the first data is possible with the ECC circuit 230 (S130). If the error correction is not possible (S130; NO), the operation is completed without executing the refresh program. If the error correction is possible (S130; YES), the CPU 220 can acquire the second data based on the first data (S150).

Subsequently, the CPU 220 performs the logical operation by using the second data and the first data stored in S220. The CPU 220 performs the logical operation of the first data and the second data to acquire third data (S260). In the memory cell transistor of which the threshold voltage is changed, the first data and the second data are different from each other. In the memory cell transistor of which the threshold voltage is not changed, the first data and the second data are the same. Therefore, the CPU 220 can acquire third data showing an error portion by performing a logical operation of the first data and the second data. That is, the third data is data acquired by the logical operation of the first data and the second data. In addition, the memory cell transistor of which the first data and the second data are different from each other is an example of the first storage element. The memory cell transistor of which the first data and the second data are the same is an example of the second storage element.

The CPU 220 writes third data obtained in S260 to any of the pages P read in S110. That is, the refresh program using the third data as the input value is executed (S270). To use the third data as the input value is to execute a refresh program on a memory cell transistor of which the threshold voltage is changed. Specifically, the first write voltage is applied to the bit line connected to the memory cell transistor of which the threshold voltage is changed to return the threshold voltage. Meanwhile, the second write voltage is applied to the bit line connected to the memory cell transistor of which the threshold voltage is not changed. The second write voltage is a voltage with which writing does not occur in the memory cell transistor. That is, writing to the memory cell transistor of which the threshold voltage is not changed is prohibited. The second write voltage is a voltage higher than the first write voltage.

This completes the refresh program.

According to the present embodiment, the same effect as the first embodiment can be obtained. Further, as writing to the memory cell transistor of which threshold voltage is not changed is not performed, a damage to the memory cell transistor can be reduced compared with the first embodiment.

Modification

Figure 11:
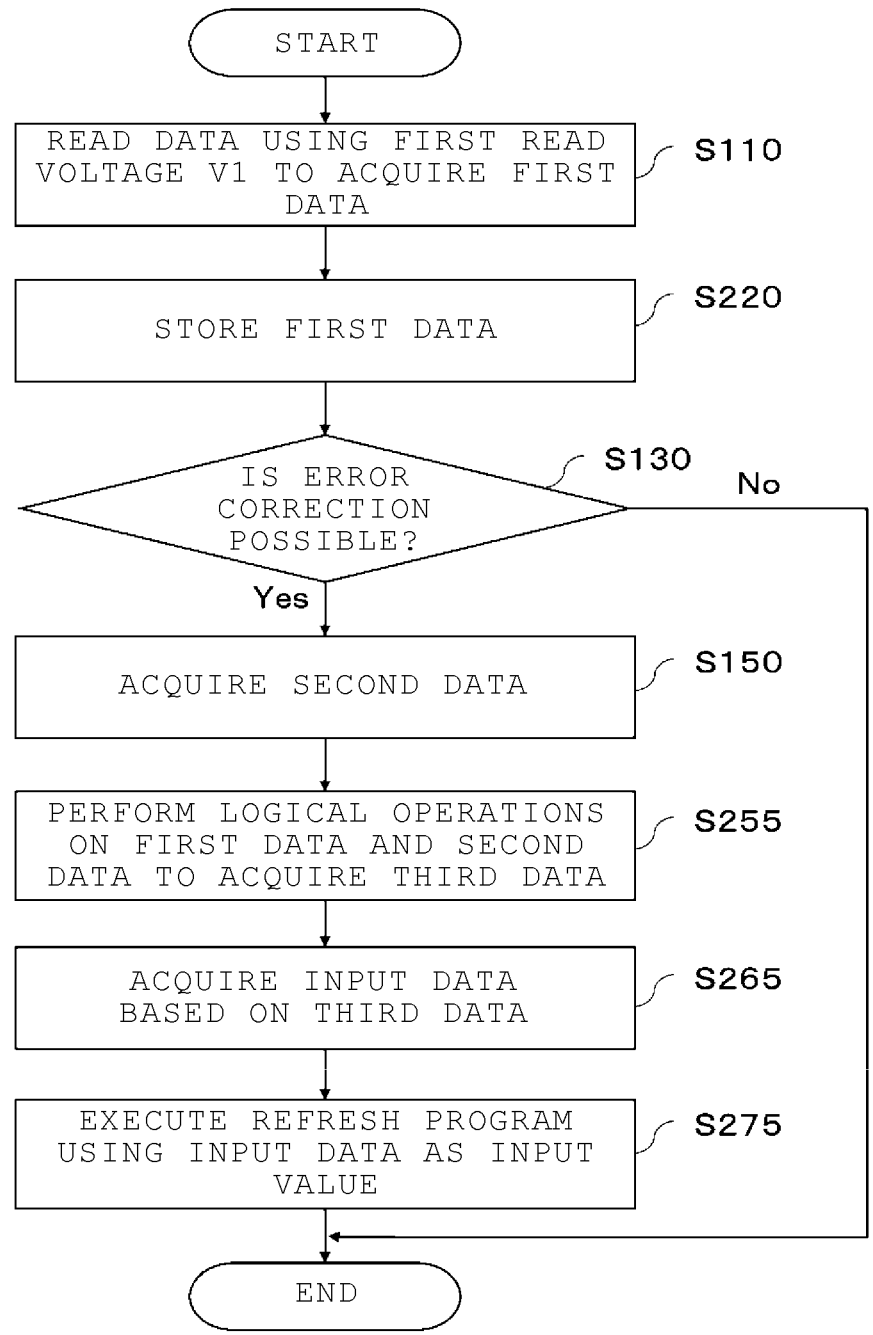
FIG. 11 is a flowchart showing a refresh program of a nonvolatile memory according to a modification.

FIG. 11 is a flowchart showing a refresh program of a nonvolatile memory according to a modification. S110 to S150 are the same as those in the second embodiment and thus are not described.

The CPU 220 performs a logical operation by using the second data and the first data stored in S220. The CPU 220 performs a logical operation of the first data and the second data to acquire third data (S255). A memory cell transistor of which the threshold voltage is changed is revealed by the third data.

The CPU 220 acquires input data based on third data (S265). The input data is data to be written to the memory cell transistor of which the threshold voltage revealed by the third data is changed.

The CPU 220 writes the input data obtained in S265 to any of the pages P read in S110. That is, the CPU 220 executes a refresh program using the input data as the input value (S275). This completes the refresh program.

Third Embodiment

An execution target of the refresh program of the third embodiment is different from the first embodiment.

Figure 12:
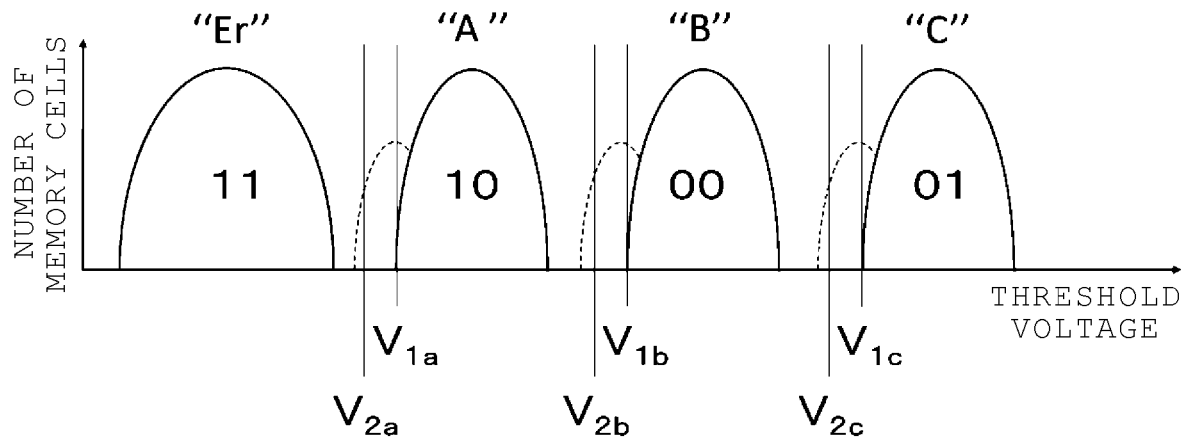
FIG. 12 is a schematic diagram illustrating a threshold voltage distribution of a nonvolatile memory according to a third embodiment.
Figure 13:
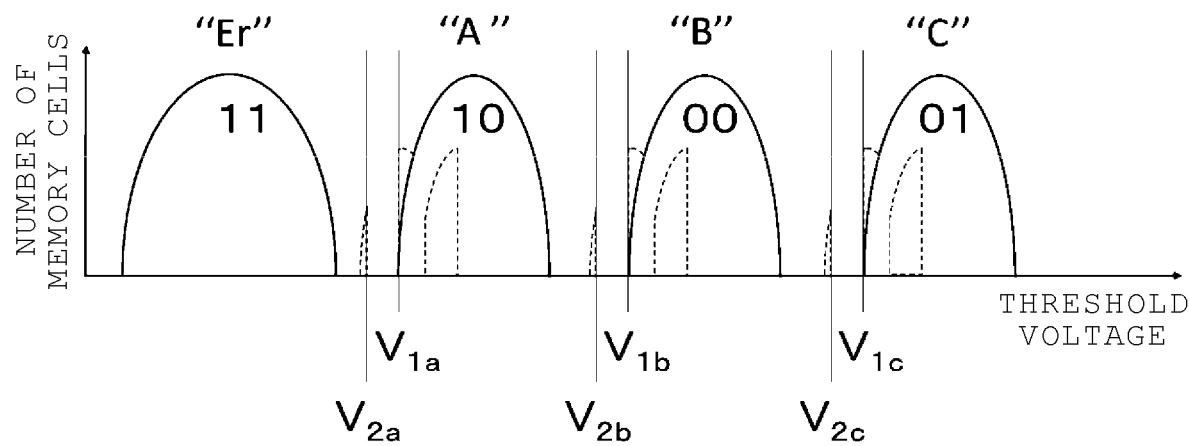
FIG. 13 is a schematic diagram illustrating the threshold voltage distribution after a refresh program of the nonvolatile memory according to the third embodiment.

FIG. 12 is a schematic diagram illustrating the threshold voltage distribution of the nonvolatile memory according to the third embodiment. FIG. 13 is a schematic diagram illustrating the threshold voltage distribution after a refresh program of the nonvolatile memory according to the third embodiment.

As illustrated in FIG. 12, a second read voltage V2a that is lower than the first read voltage V1a can be set between the maximum threshold voltage in the "Er" state and the minimum threshold voltage in the "A" state. A second read voltage V2b lower than the first read voltage V1b can be set between the "A" state and the "B" state. A second read voltage V2c that is lower than the first read voltage V1c can be set between the "B" state and the "C" state. If the second read voltages V2a, V2b, and V2c are not distinguished, the second read voltages V2a, V2b, and V2c are simply referred to as the second read voltages V2.

According to the present embodiment, the memory cell transistor shown between the first read voltage V1 and the second read voltage V2 among the memory cell transistors of which the threshold values shown by the dotted line of FIG. 12 are changed becomes the target of the refresh program. If the refresh program is executed on the memory cell transistor shown between the first read voltage V1 and the second read voltage V2 shown in FIG. 12, threshold voltage distributions shown in FIG. 13 are obtained.

Figure 14:
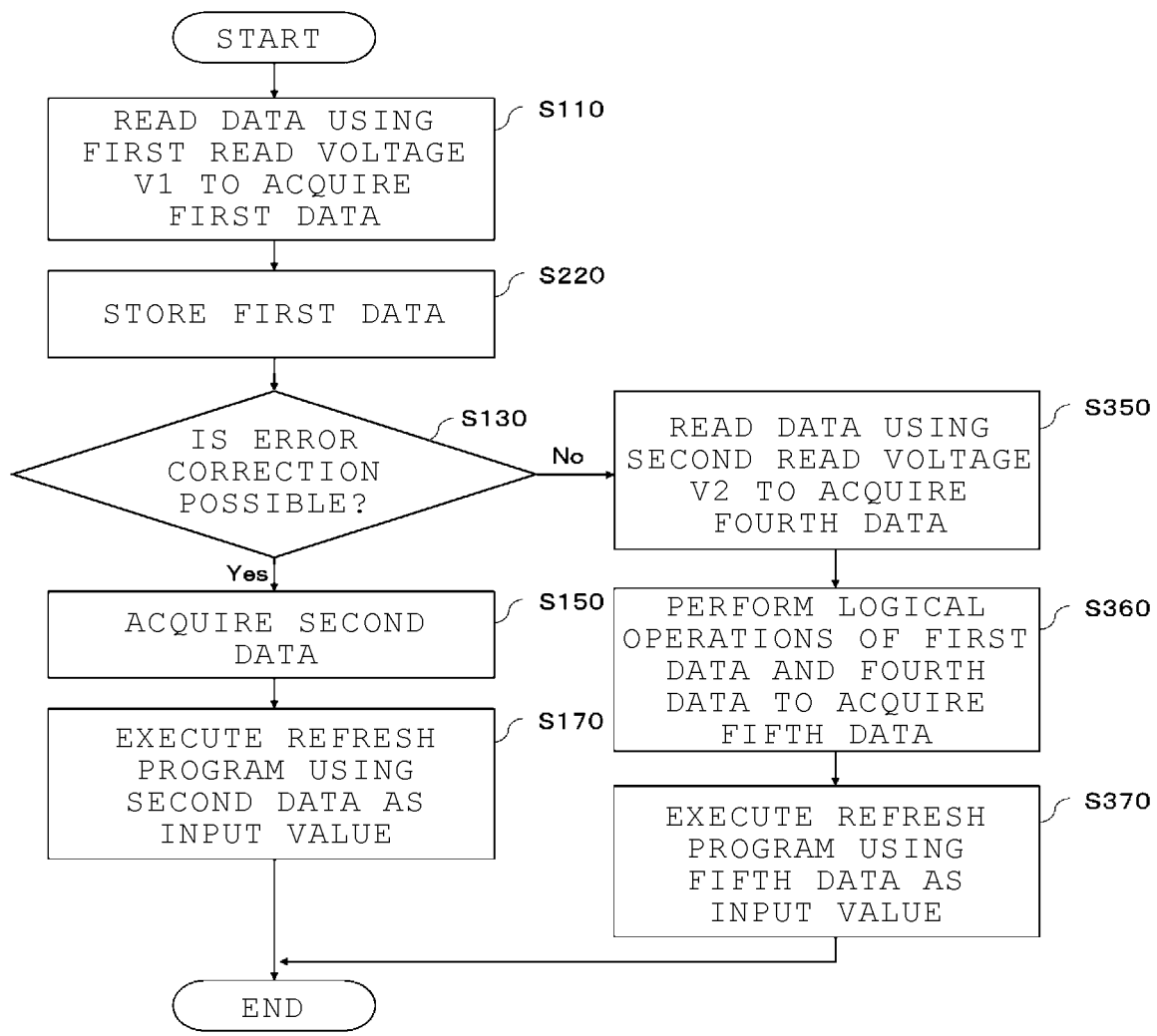
FIG. 14 is a flowchart showing a refresh program of the nonvolatile memory according to the third embodiment.

FIG. 14 is a flowchart of the refresh program of the nonvolatile memory according to the third embodiment.

S110 to S130 are the same as those described in the second embodiment. If the error correction of the first data is possible with the ECC circuit 230 (S130; YES), S150 and S170 are performed in the same manner as in the first embodiment. Further, S150 to S270 may be performed in the same manner as in the second embodiment.

Meanwhile, if the error correction of the first data is not possible with the ECC circuit 230 (S130; NO), the CPU 220 reads data by using the second read voltage V2 from any of the pages P read in S110 (S350). The data read with the second read voltage V2 is referred to as fourth data.

Subsequently, the CPU 220 performs a logical operation by using the fourth data and the first data stored in S220. The CPU 220 performs a logical operation of the first data and the fourth data and acquires fifth data (S360). The fifth data is data acquired by the logical operation of the first data and the fourth data. The memory cell transistor of which the first data and the fourth data are different from each other is a memory cell transistor shown between the first read voltage V1 and the second read voltage V2. The memory cell transistor of which the first data and the fourth data are the same is a memory cell transistor other than the memory cell transistor shown between the first read voltage V1 and the second read voltage V2. In addition, the memory cell transistor of which the first data and the fourth data are different from each other is an example of the third storage element. The memory cell transistor of which the first data and the fourth data are the same is an example of the fourth storage element.

The CPU 220 writes the fifth data obtained in S360 in any of the pages P read in S110. That is, the refresh program using the fifth data as the input value is executed (S370). To use the fifth data as the input value is to execute the refresh program in the memory cell transistor shown between the first read voltage V1 and the second read voltage V2 of FIG. 11. Specifically, the first write voltage is applied to a bit line connected to the memory cell transistor shown between the first read voltage V1 and the second read voltage V2 and returns the threshold voltage. Meanwhile, the second write voltage is applied to a bit line connected to the memory cell transistor other than the memory cell transistor shown between the first read voltage V1 and the second read voltage V2. Accordingly, the second data can be stored.

This completes the refresh program. In addition, the CPU 220 may acquire the fifth data by performing the logical operation between the first data and the fourth data, acquire the input data based on the fifth data, and write the input data to any of the pages P read in S110.

According to the present embodiment, the effect that is the same as the first embodiment can be obtained. In addition, even when there are many memory cell transistors of which the threshold voltage is changed and thus the error correction cannot be performed, the second data can be stored without performing the read retry operation. That is, regardless of the error correction in the ECC circuit 230, the operation processing time of the memory system 1 is shortened, and the reliability of the nonvolatile memory 100 can be improved.

Fourth Embodiment

Figure 15:
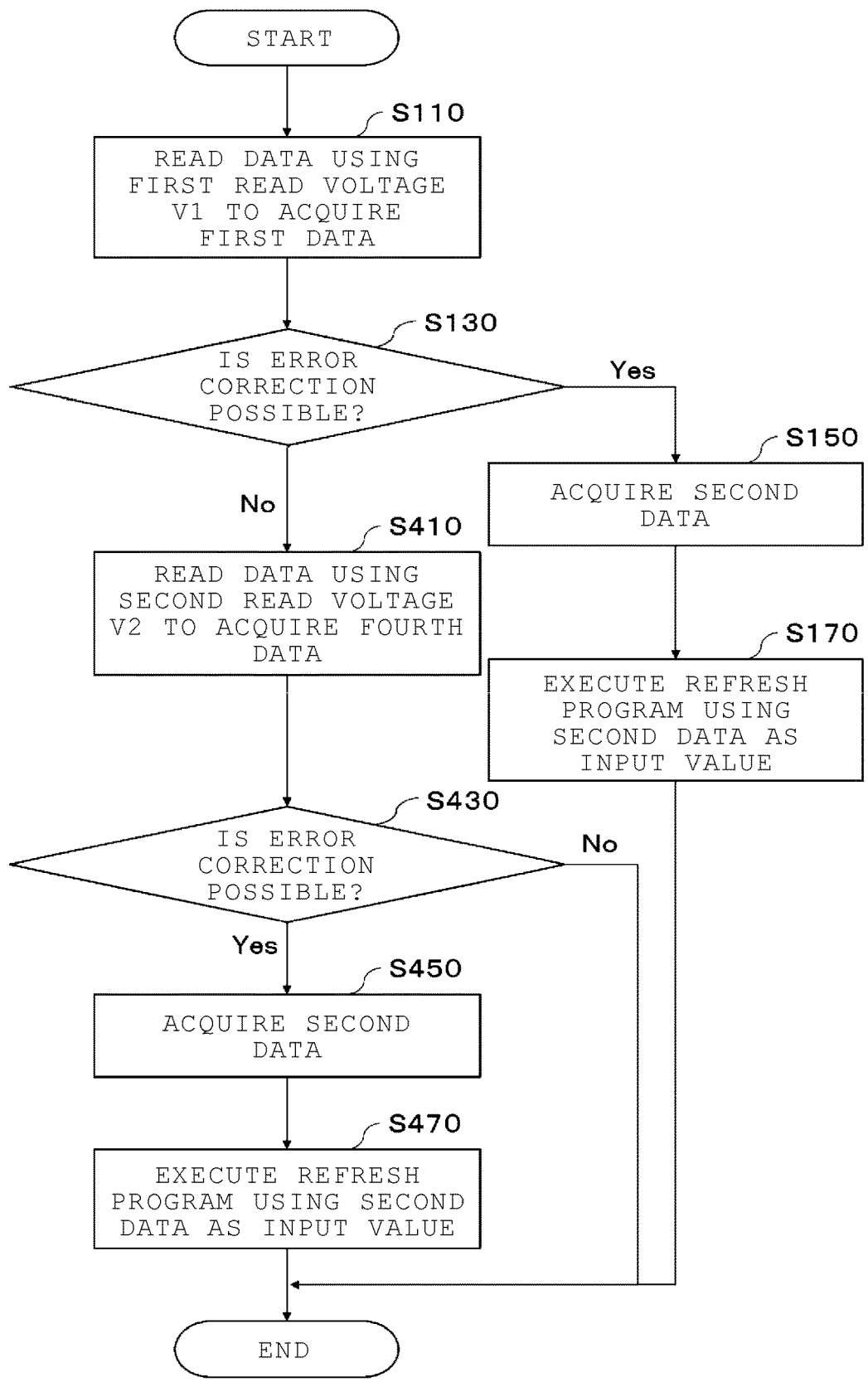
FIG. 15 is a flowchart showing a refresh program of the nonvolatile memory according to a fourth embodiment.

FIG. 15 is a flowchart of the refresh program of the nonvolatile memory according to a fourth embodiment. The fourth embodiment is different from the first embodiment in that the process the same as in the first embodiment is performed again when the error correction is not possible with the ECC circuit 230.

S110 to S130 are the same as those in the first embodiment. In addition, even if the error correction of the first data is possible with the ECC circuit 230 (S130; YES), S150 to S170 are the same as those in the first embodiment.

If the error correction of the first data cannot be performed with the ECC circuit 230 (S130; NO), the CPU 220 reads data by using the second read voltage V2 from any of the pages P read in S110 to acquire the fourth data (S410).

Subsequently, the CPU 220 verifies whether the fourth data error correction is possible with the ECC circuit 230 (S430). If the error correction is not possible (S430; NO), the operation is completed without executing the refresh program. If the error correction is possible (S430; YES), the CPU 220 can acquire the second data based on the fourth data (S450). That is, the second data is data obtained by correcting the fourth data with the ECC circuit 230.

The CPU 220 writes the second data to any of the pages P read in S110. That is, the refresh program using the second data as the input value is executed (S470). To use the second data as the input value is to execute the refresh program on all of the memory cell transistors in any of the pages P. For example, in the refresh program of the present embodiment, the first write voltage is applied to the bit line connected to the memory cell transistor to perform writing. In addition, the first write voltage is applied once. In addition, after the first write voltage is applied, the verification operation is not performed.

This completes the refresh program. The same is performed on the other data provided in the same block BLK.

According to the present embodiment, the same effect as in the first embodiment can be obtained.

Fifth Embodiment

Figure 16:
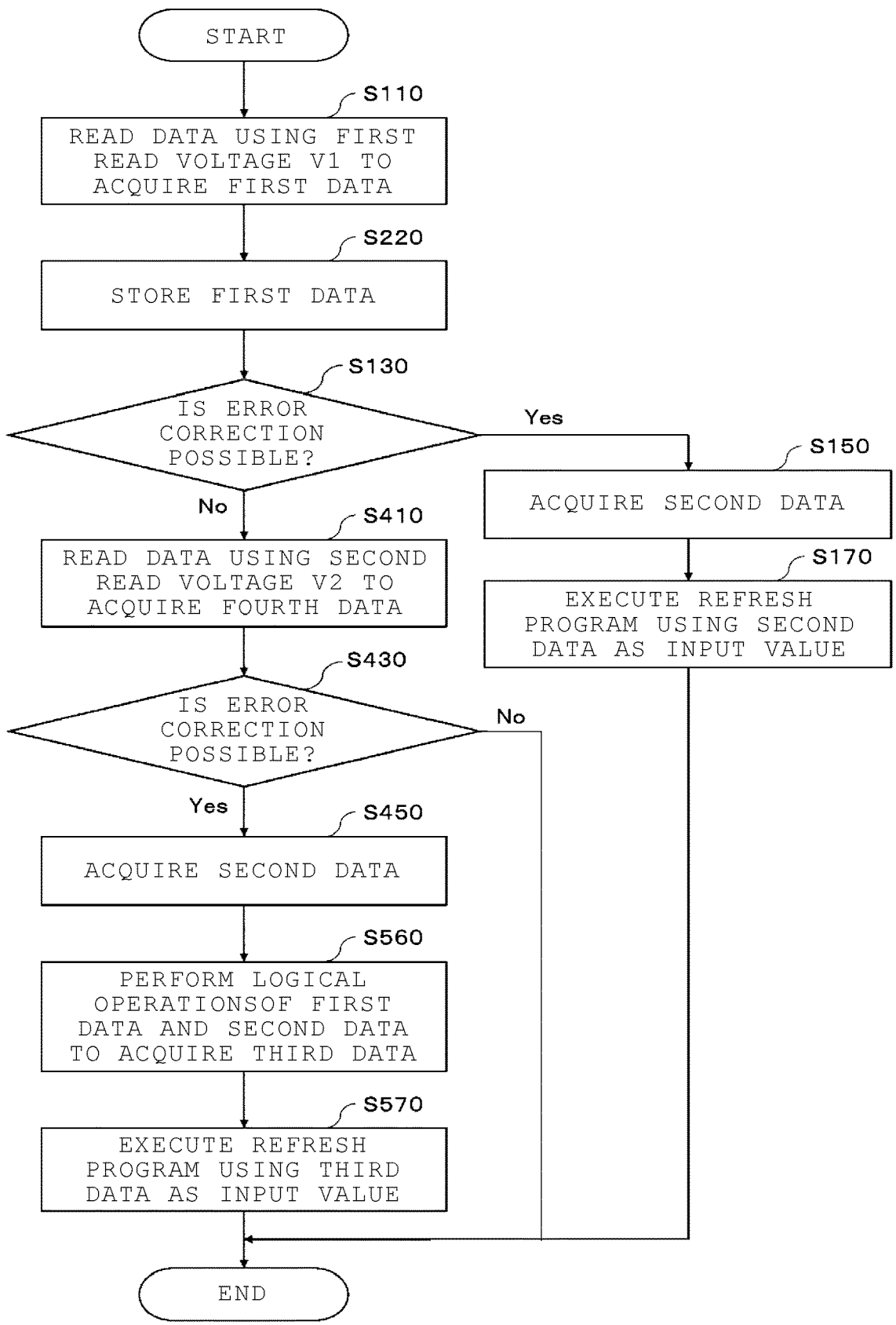
FIG. 16 is a flowchart showing a refresh program of a nonvolatile memory according to a fifth embodiment.

FIG. 16 is a flowchart of the refresh program of the nonvolatile memory according to a fifth embodiment. The fifth embodiment is different from the second embodiment in that the same process as in the second embodiment is performed again if the error correction is not possible with the ECC circuit 230.

S110 to S130 are the same as those in the second embodiment. In addition, also when the error correction of the first data is possible with the ECC circuit 230 (S130; YES), S150 to S170 are the same as those in the first embodiment. When the error correction of the first data is not possible with the ECC circuit 230 (S130; NO), S410 to S450 are the same as those in the fourth embodiment.

The CPU 220 performs a logical operation by using the second data and the first data stored in S220. The CPU 220 performs a logical operation of the first data and the second data to acquire third data (S560). In the memory cell transistor of which the threshold voltage is changed, the first data and the second data are different from each other. In the memory cell transistor of which the threshold voltage is not changed, the first data and the second data are the same. Therefore, for example, the CPU 220 performs a logical operation of the first data and the second data to acquire the third data showing the error portion.

The CPU 220 writes the third data obtained in S560 in any of the pages P read in S110. That is, the CPU 220 executes the refresh program using the third data as the input value (S570). To use the third data as the input value is to execute the refresh program on the memory cell transistor of which the threshold voltage is changed. Specifically, the first write voltage of which the threshold voltage is changed is applied to a bit line connected to the memory cell transistor to return the threshold voltage. Meanwhile, the second write voltage is applied to a bit line connected to the memory cell transistor of which the threshold voltage is not changed.

This completes the refresh program.

According to the present embodiment, the same effect as in the second embodiment can be obtained.

Sixth Embodiment

Figure 17:
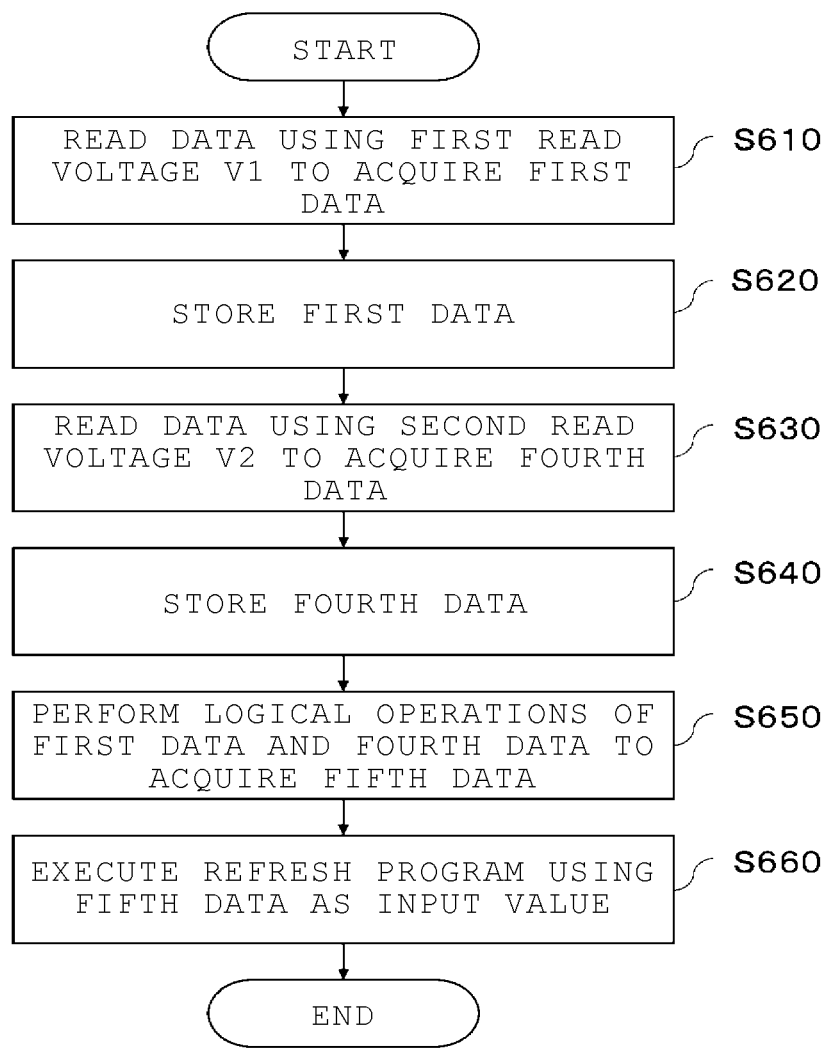
FIG. 17 is a flowchart showing a refresh program of a nonvolatile memory according to a sixth embodiment.

FIG. 17 is a flowchart of the refresh program of the nonvolatile memory according to a sixth embodiment. The sixth embodiment is different from the first embodiment in that the refresh program is executed in the nonvolatile memory 100.

The nonvolatile memory 100 receives the command that instructs the refresh program from the memory controller 200. The nonvolatile memory 100 executes the refresh program according to the reception of the command for instructing the refresh program.

First, the sequencer 140 reads data by using the first read voltage V1 from any of the pages P (S610). The sequencer 140 stores the read first data, for example, in the data latch XDL (S620). The data latch XDL is an example of the first data latch.

Subsequently, the sequencer 140 reads data by using the second read voltage V2 from any of the pages P read in S610 (S630). The sequencer 140 stores the read fourth data, for example, to the data latch SDL (S640). The data latch SDL is an example of the second data latch.

The sequencer 140 acquires fifth data by using the first data stored in the data latch XDL and the fourth data stored in the data latch SDL. The sequencer 140 performs, for example, a logical operation of the first data and the fourth data to acquire the fifth data (S650). The sequencer 140 stores the obtained fifth data, for example, to the data latch XDL. That is, the data stored in the data latch XDL is changed from the first data to the fifth data.

The sequencer 140 writes the fifth data stored in the data latch XDL to any of the pages P read in S610. That is, the refresh program using the fifth data as the input value is executed (S660). To use the fifth data as the input value is to execute the refresh program on the memory cell transistor shown between the first read voltage V1 and the second read voltage V2 of FIG. 11. Specifically, the first write voltage is applied to the memory cell transistor shown between the first read voltage V1 and the second read voltage V2 to return the threshold voltage. Meanwhile, the second write voltage is applied to the memory cell transistor other than the memory cell transistor shown between the first read voltage V1 and the second read voltage V2. Accordingly, the second data can be stored.

This completes the refresh program. In addition, after the fifth data is acquired by performing the logical operation of the first data and the fourth data, the sequencer 140 may acquire the input data based on the fifth data and write the input data to any of the pages P read in S610. In this case, for example, the sequencer 140 stores the fifth data in the data latch ADL. The sequencer 140 acquires the input data based on the fifth data stored in the data latch ADL and stores the input data in the data latch XDL. The data latch ADL is an example of the third data latch.

Effect

According to the present embodiment, the same effect as in the first embodiment can be obtained. In addition, according to the present embodiment, the refresh program can be executed in the nonvolatile memory 100, and thus the first data and the fourth data are not required to be transmitted to the memory controller 200. The fifth data is not required to be transmitted from the memory controller 200 to the nonvolatile memory 100. Further, since the data does not pass through the ECC circuit 230, the data error does not have to be detected or corrected. That is, compared with the first embodiment, the operation time can be shortened.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
 a nonvolatile memory including a plurality of word lines, a plurality of bit lines, and a plurality of storage elements; and
 a control circuit including an ECC circuit, the ECC circuit configured to detect and correct a data error stored in the plurality of storage elements, the control circuit configured to:
  acquire first data by reading data stored in the plurality of storage elements of a page, the page connected to the word line with a first read voltage,
  acquire second data obtained by correcting the first data when the first data is correctable by the ECC circuit, and
  write data based on the second data to the plurality of storage elements of the page;
 wherein when the first data is not correctable by the ECC circuit, the control circuit is further configured to:
  acquire fourth data by reading data stored in the plurality of storage elements of the page by using a second read voltage different from the first read voltage.

2. The memory system according to claim 1,
wherein the control circuit is configured to write the second data by applying the first write voltage to the word line connected to the plurality of storage elements of the page.

3. The memory system according to claim 2,
wherein the control circuit is configured to apply the first write voltage once to the word line.

4. The memory system according to claim 2,
wherein the control circuit is configured to not perform a verification operation after the first write voltage is applied.

5. The memory system according to claim 1,
wherein the control circuit is configured to:
perform a logical operation of the first data and the second data,
acquire third data, and
write the third data to the plurality of storage elements of the page.

6. The memory system according to claim 5,
wherein the plurality of storage elements of the page include a first storage element of which the first data and the second data are different from each other, and a second storage element of which the first data and the second data are the same,
the plurality of bit lines includes a first bit line connected to the first storage element and a second bit line connected to the second storage element, and
the control circuit is configured to:
perform writing by applying a first write voltage to the first bit line when the third data is written, and
prohibit writing to the second storage element by applying a second write voltage different from the first write voltage to the second bit line.

7. The memory system according to claim 1,
wherein the control circuit is configured to:
acquire third data by performing a logical operation of the first data and the second data,
acquire input data based on the third data, and
write the input data to the plurality of storage elements of the page.

8. The memory system according to claim 1,
wherein when the first data is not correctable by the ECC circuit, the control circuit:
acquires fifth data by performing a logical operation of the first data and the fourth data, and
writes the fifth data to the storage elements of the page.

9. The memory system according to claim 8,
wherein the plurality of storage elements of the page include a third storage element of which the first data and the fourth data are different from each other, and a fourth storage element of which the first data and the fourth data are the same,
the plurality of bit lines includes a third bit line connected to the third storage element, and a fourth bit line connected to the fourth storage element, and
the control circuit is configured to:
perform writing by applying a first write voltage to the third bit line when the fifth data is written, and
prohibit writing to the fourth storage element by applying a second write voltage, different from the first write voltage, to the fourth bit line.

10. The memory system according to claim 1,
wherein when the first data is not correctable by the ECC circuit, the control circuit is configured to:
acquire fourth data by reading data stored in the plurality of storage elements of the page with a second read voltage, the second read voltage being lower than the first read voltage,
acquire fifth data by performing a logical operation of the first data and the fourth data, acquires input data based on the fifth data, and
write the input data to the storage elements of the page.

11. A nonvolatile memory comprising:
a plurality of word lines;
a plurality of bit lines;
a memory cell array including a plurality of storage elements; and
a control circuit configured to:
acquire first data by reading data stored in the plurality of storage elements of a page connected to a same word line with a first read voltage,
acquire fourth data by reading data stored in the plurality of storage elements of the page with a second read voltage,
acquire fifth data by performing a logical operation of the first data and the fourth data, and
perform writing based on the fifth data to the plurality of storage elements of the page;
wherein the plurality of storage elements of the page include a third storage element of which the first data and the fourth data are different from each other, and a fourth storage element of which the first data and the fourth data are the same.

12. The nonvolatile memory according to claim 11,
wherein the control circuit is configured to:
acquire the fifth data by performing a logical operation of the first data and the fourth data, and
write the fifth data to the plurality of storage elements of the page.

13. The nonvolatile memory according to claim 12, further comprising:
a first data latch that stores the first data; and
a second data latch that stores the fourth data.

14. The nonvolatile memory according to claim 11,
wherein
the plurality of bit lines includes a third bit line connected to the third storage element and a fourth bit line connected to the fourth storage element, and
the control circuit is configured to:
perform writing by applying a first write voltage to the third bit line when the fifth data is written, and
prohibit writing to the fourth storage element by applying a second write voltage different from the first write voltage to the fourth bit line.

15. The nonvolatile memory according to claim 11,
wherein the control circuit is configured to:
acquire the fifth data by performing a logical operation of the first data and the fourth data,
acquire input data based on the fifth data, and
write the input data to the plurality of storage elements of the page.

16. The nonvolatile memory according to claim 15, further comprising:
a first data latch configure to store the first data;
a second data latch configured to store the fourth data; and
a third data latch configure to store the fifth data.

17. A memory system comprising:
a nonvolatile memory including a plurality of word lines, a plurality of bit lines, and a plurality of storage elements;

a control circuit including an ECC circuit, the ECC circuit configured to detect and correct a data error stored in the plurality of storage elements, the control circuit configured to:
    acquire first data by reading data stored in the plurality of storage elements of a page, the page connected to the word line with a first read voltage,
    acquire second data obtained by correcting the first data when the first data is correctable by the ECC circuit,
    write data based on the second data to the plurality of storage elements of the page;
    perform a logical operation of the first data and the second data,
    acquire third data,
    write the third data to the plurality of storage elements of the page;
wherein the plurality of storage elements of the page include a first storage element of which the first data and the second data are different from each other, and a second storage element of which the first data and the second data are the same, the plurality of bit lines includes a first bit line connected to the first storage element and a second bit line connected to the second storage element, and the control circuit is further configured to:
    perform writing by applying a first write voltage to the first bit line when the third data is written, and
    prohibit writing to the second storage element by applying a second write voltage different from the first write voltage to the second bit line.

18. The memory system according to claim 17, wherein when the first data is not correctable by the ECC circuit, the control circuit is configured to:
    acquire fourth data by reading data stored in the plurality of storage elements of the page with a second read voltage, the second read voltage being lower than the first read voltage,
    acquire fifth data by performing a logical operation of the first data and the fourth data, acquires input data based on the fifth data, and
    write the input data to the storage elements of the page.

\* \* \* \* \*